United States Patent
Birsan et al.

(10) Patent No.: US 9,690,726 B2
(45) Date of Patent: Jun. 27, 2017

(54) PERIPHERAL REGISTER PARAMETER REFRESHING

(71) Applicant: Atmel Corporation, San Jose, CA (US)

(72) Inventors: Laurentiu Birsan, Saint Herblain (FR); Stein Danielsen, Flatasen (NO)

(73) Assignee: Atmel Corporation, San Jose, CA (US)

( * ) Notice: Subject to any disclaimer, the term of this patent is extended or adjusted under 35 U.S.C. 154(b) by 413 days.

(21) Appl. No.: 14/538,305

(22) Filed: Nov. 11, 2014

(65) Prior Publication Data
US 2016/0132445 A1 May 12, 2016

(51) Int. Cl.
*G06F 13/28* (2006.01)
*H03M 1/12* (2006.01)
*H03M 1/18* (2006.01)

(52) U.S. Cl.
CPC ............ *G06F 13/287* (2013.01); *H03M 1/12* (2013.01); *H03M 1/18* (2013.01); *Y02B 60/1228* (2013.01)

(58) Field of Classification Search
CPC ......... G06F 13/287; H03M 1/12; H03M 1/18; Y02B 60/1228
See application file for complete search history.

(56) References Cited

U.S. PATENT DOCUMENTS

| 5,815,734 A * | 9/1998 | Lee ............................ G06F 1/08 710/104 |
| 6,457,074 B1 * | 9/2002 | Gaillard .................. G06F 13/28 710/107 |
| 6,499,077 B1 | 12/2002 | Abramson |
| 7,398,335 B2 | 7/2008 | Sonksen |
| 2003/0221026 A1 | 11/2003 | Newman |
| 2014/0089536 A1 * | 3/2014 | Pedersen ............. H03M 1/1215 710/22 |
| 2015/0161065 A1 | 6/2015 | Lunadier et al. |
| 2015/0188562 A1 * | 7/2015 | Lam ........................ H03M 3/38 341/120 |
| 2016/0098375 A1 | 4/2016 | Pean et al. |
| 2016/0124878 A1 | 5/2016 | Pean et al. |

* cited by examiner

*Primary Examiner* — Eric Oberly
(74) *Attorney, Agent, or Firm* — Fish & Richardson P.C.

(57) ABSTRACT

Systems, methods, circuits and computer-readable mediums for peripheral sequencing using an access sequence are disclosed. In some implementations, a control register and status register in a peripheral are initialized with control data for selecting peripheral registers of the peripheral to be refreshed during an access sequence. For each peripheral register to be refreshed during the access sequence: a data register of the peripheral register is accessed; the peripheral register is refreshed; and the status register is updated with a current status of the access sequence. The access sequence is determined to be completed based on contents of the status register.

19 Claims, 5 Drawing Sheets

| RegA | REGISTER A | 0x00 |
|------|------------|------|
| RegB | REGISTER B | 0x01 |
| RegC | REGISTER C | 0x02 |
| RegD | REGISTER D | 0x03 |
|      | RESERVED   | 0x04 |
| RegE | REGISTER E | 0x05 |
| RegF | REGISTER F | 0x06 |
| RegG | REGISTER G | 0x07 |
| RegH | REGISTER H | 0x08 |

FIG. 3A

| VALUE   | 0    | 0    | 0    | 1    | 1    | 0    | 0    | 1    |
|---------|------|------|------|------|------|------|------|------|
| DMACTRL | RegH | RegG | RegF | RegE | RegD | RegC | RegB | RegA |

FIG. 3B

| DMASTATUS | RegH | RegG | RegF | RegE | RegD | RegC | RegB | RegA |
|-----------|------|------|------|------|------|------|------|------|

PERIPHERAL REGISTER PARAMETER REFRESHING

TECHNICAL FIELD

This disclosure relates generally to refreshing peripheral parameters.

BACKGROUND

Microcontrollers can be configured to communicate with a variety of peripherals using a direct memory access (DMA) system. In many real-time applications, a set of peripheral registers are refreshed with new parameters. The refresh can be done by software and a central processing unit (CPU), but the latency introduced by an interrupt execution may be significant in real-time applications. Additionally, power consumption can increase if the parameters are updated often.

SUMMARY

Systems, methods, circuits and computer-readable mediums for peripheral sequencing using an access sequence are disclosed. In some implementations, a control register and status register in a peripheral are initialized with control data for selecting peripheral registers of the peripheral to be refreshed during an access sequence. For each peripheral register to be refreshed during the access sequence: a data register of the peripheral register is accessed; the peripheral register is refreshed; and the status register is updated with a current status of the access sequence. The access sequence is determined to be completed based on contents of the status register. Other implementations are directed to systems, methods, circuits and non-transitory, computer-readable mediums.

DETAILED DESCRIPTION

Figure 1:
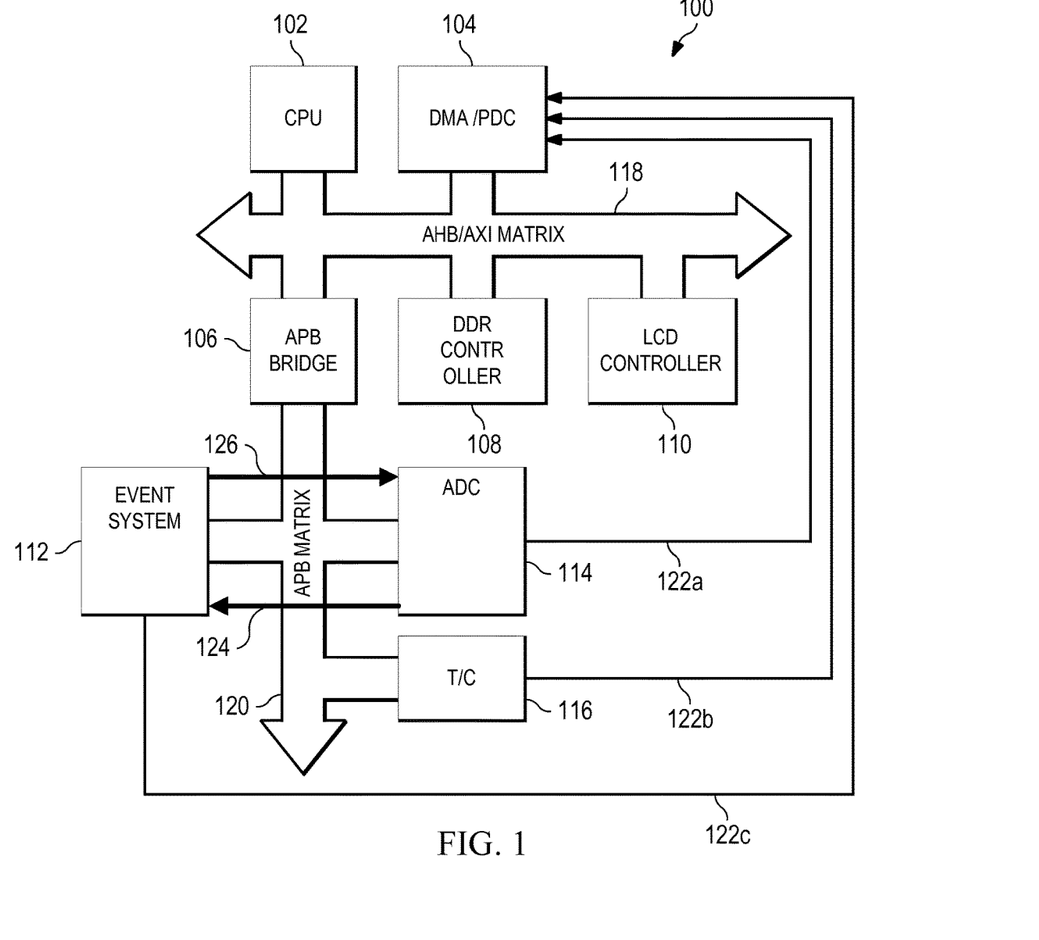
FIG. 1 is a block diagram of an example microcontroller system including peripheral sequencing using DMA.

FIG. 1 is a block diagram of an example microcontroller system 100 including peripheral sequencing using DMA. In some implementations, microcontroller system 100 can include CPU 102, controller 104, peripheral bus bridge 106, memory controller 108, display controller 110 and several example peripheral devices 112, 114, 116. In practice, system 100 can include more or fewer components or subsystems than is shown in FIG. 1.

Controller 104 can be, for example, a system DMA controller or peripheral DMA controller (PDC). A system DMA controller transfers data between memories and peripherals with minimal CPU intervention. While the CPU spends time in low-power sleep modes or performs other tasks, the DMA controller offloads the CPU by taking care of data copying from one area to another. A complete DMA read and write operation between memories and/or peripherals is called a DMA transaction. A transaction is performed in data blocks and the size of the transaction (number of bytes to transfer) is selectable from software and controlled by the block size and repeat counter settings.

A PDC transfers data between on-chip serial peripherals and on and/or off-chip memories. Using the PDC removes processor overhead by reducing its intervention during the transfer. This significantly reduces the number of clock cycles required for a data transfer, which improves microcontroller system performance. To launch a transfer, the peripheral triggers its associated PDC channels by using handshake signals. When the programmed data is transferred, an end of transfer interrupt is generated by the peripheral itself.

Peripheral bridge 106 can be, for example, an advanced microcontroller bus architecture (AMBA) peripheral bus (APB) bridge that bridges an advanced high performance bus/AMBA Advanced eXtensible Interface (AHB/AXI) matrix 118 with an APB Matrix 120. Memory controller 108 can be, for example, a double data rate (DDR) memory controller used to drive DDR memory (e.g., SDRAM), where data is transferred on both rising and falling edges of the system's memory clock. Display controller 110 can be, for example a liquid crystal display (LCD) controller for running a segment of an LCD display.

The example peripherals include an event system 112, an analog to digital converter (ADC) 114, and a timer/counter (T/C) module 116. The event system 112 can be a module that routes events reported from modules within the system to appropriate destinations. For example, the T/C module 116 can generate an event 124 and send the event to the event system 112, which can in turn send the event 126 to the ADC 114. This is useful, e.g., to cause the ADC to sample a voltage periodically.

One or more of the peripherals can include a DMA sequencer to initiate a DMA sequence trigger. In some implementations, peripherals 112, 114, 116 each have a physically separate communication link 122a-122c (each physically separate and independent of the system bus channels) to controller 104 that allows each of peripherals 112, 114, 116 to communicate directly with controller 104.

Figure 2:
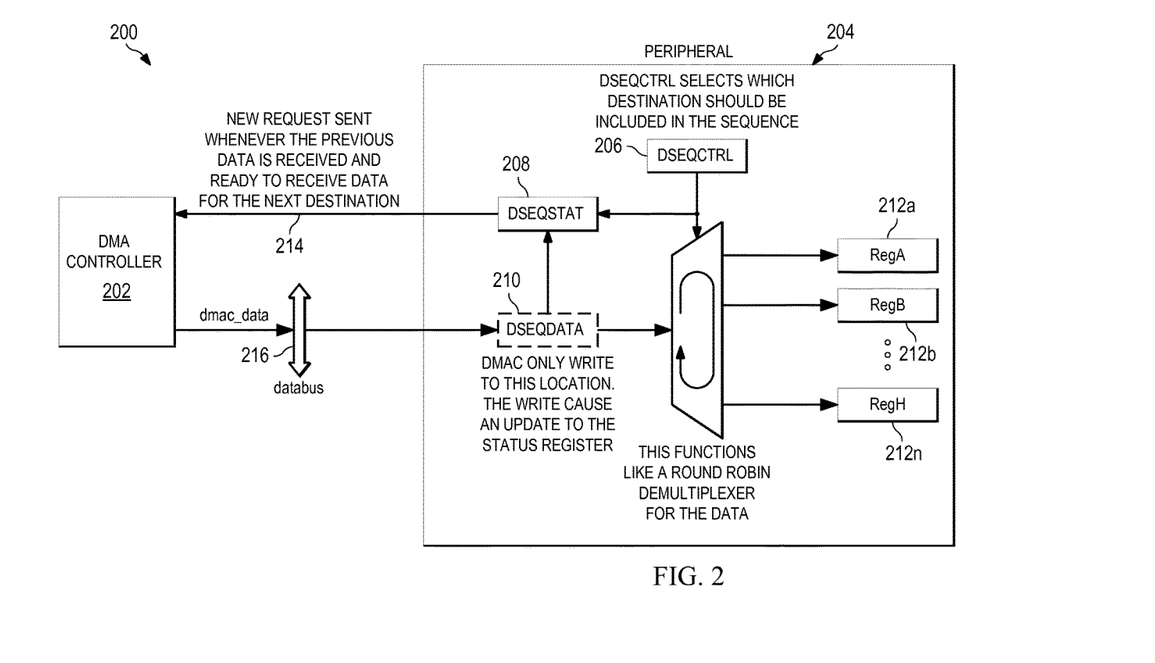
FIG. 2 is a block diagram illustrating peripheral sequencing using DMA.

FIG. 2 is a block diagram illustrating peripheral sequencing using DMA. In some implementations, DMA system 200 includes a DMA controller 202 and at least one peripheral 204. DMA system 200 can include a number of channels, each having individual settings to transfer data to/from memory to peripheral 204. A data transfer can start when DMA controller 202 receives a trigger from the peripheral or from a CPU. Some examples of peripherals include but are not limited to: a timer/counter (T/C) module, analog-to-digital-converter (ADC) and digital-to-analog converter (DAC). When the trigger is received, a data transfer or multiple data transfers (e.g., a burst transfer) are completed before DMA controller 202 can accept a new trigger. In general, a trigger is received by DMA controller 202 when a peripheral "cycle" is completed and the peripheral registers can be safely refreshed. For example, a trigger can be generated by an ADC or DAC when a data conversion result is available in the peripheral. When an ADC trigger is received a user may want to change the ADC input selection. If the input selection is changed, some other parameters may be refreshed as well (e.g., offset, gain correction) to ensure the final result is accurate. A trigger can also be generated by a T/C module when a compare operation between a counter value and a programmable register results in a match. When the trigger is generated, the user may want to change the timer period and compare register settings.

In DMA system 200, when trigger 214 is received, DMA controller 202 transfers data between system memory (not shown) and peripheral 204. There are two issues with this data transfer. First, the trigger is cleared only if DMA controller 202 reads or writes to a specific peripheral address. For example, in the case of an ADC, the trigger is cleared only if a RESULT register storing the conversion result is read. Second, in any DMA system, the address (source or destination) is incremented with the same increment value (+1, +2, +4, etc.). This requires a specific peripheral address mapping register definition, which may not fit specific applications.

Figure 3A:
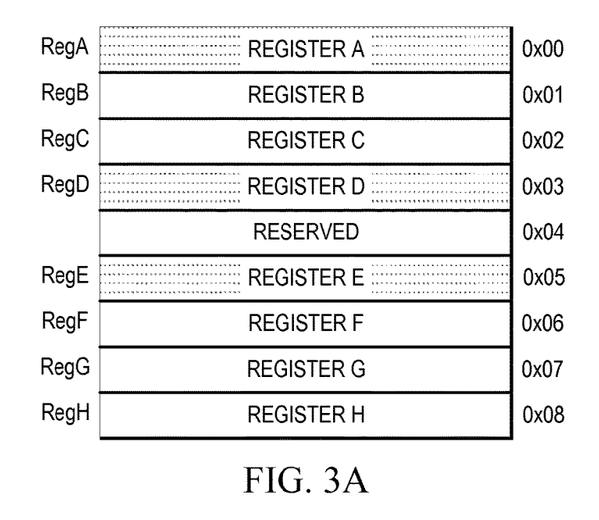
FIG. 3A-3C illustrates registers used in peripheral sequencing using DMA.
Figure 3B:
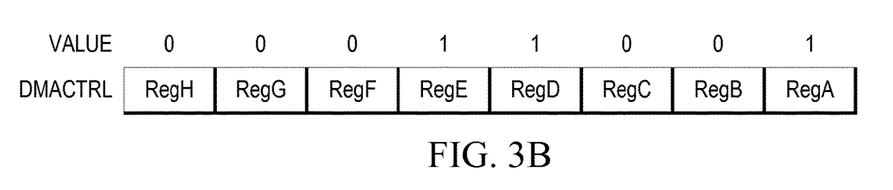
Figure 3C:
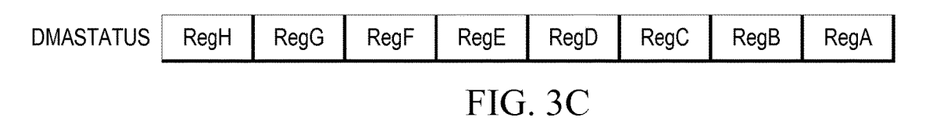

Referring to FIGS. 2 and 3, in some implementations peripheral 204 includes three registers 206, 208, 210 for peripheral sequencing using DMA. Registers 206, 208, 210 interoperate to provide a "round robin" demultiplexer for data on data bus 216. Control register 206 (DMACTRL) is initialized with control data (e.g., programmed by the CPU) before a DMA sequence starts to select which peripheral registers 212a-212n are to be refreshed during the DMA sequence. In some implementations, after initialization control register 206 stores control data (e.g., a set of bits) which identify which peripheral registers will be updated. As shown in FIGS. 3A and 3B, there are 8 peripheral registers (labeled as Registers A-H). In this example, the physical memory addresses for the 8 registers start at 0x00 and end at 0x08.

In this example, the trigger is generated when an ADC conversion has completed and the three peripheral registers to be refreshed are Registers A, D and E, as indicated by shading in FIG. 3A. The parameters to be refreshed in these registers are as follows: Register A=input, Register B=offset correction and Register E=gain correction. Thus, the peripheral memory address pointer is incremented by 3 (from Register A to Register D) and by 2 (from Register D to Register E). A conventional DMA system cannot efficiently refresh the ADC configuration data because the memory addresses are not contiguous and the memory address (source or destination) are incremented with the same value (+1, +2, +4).

To access registers A, D and E in a DMA sequence, the value 0x19 (8'b00011001) is written to control register 206, where each bit position corresponds to peripheral register, as shown in FIG. 3B. In this example, the bit positions 1, 4, 5 in control register 206 (counting from LSB to MSB), corresponding to Registers A, D, E, each contain a 1 value and the other bit positions each contain a 0 value. For high flexibility, control register 206 can include all peripheral registers in a system (e.g., a microcontroller system).

Status register 208 (DMASTAT) is updated when the CPU writes to control register 206 and when data register 210 access is completed. When all status bits in status register 208 are cleared (0 value), the DMA sequence is completed and the bit values in control register 206 are loaded into status register 208 to start the next DMA sequence. In some implementations, status register 208 stores the same number of bits as stored in control register 206.

Data register 210 (DMADATA) stores data to be transferred between memory and the peripheral register to be updated. When DMA controller 202 writes or reads data register 210, status register 208 is updated. For example, the least significant bit (LSB) in status register 208 with a 1 value is cleared, as described in more detail in reference to FIG. 4.

Figure 4:
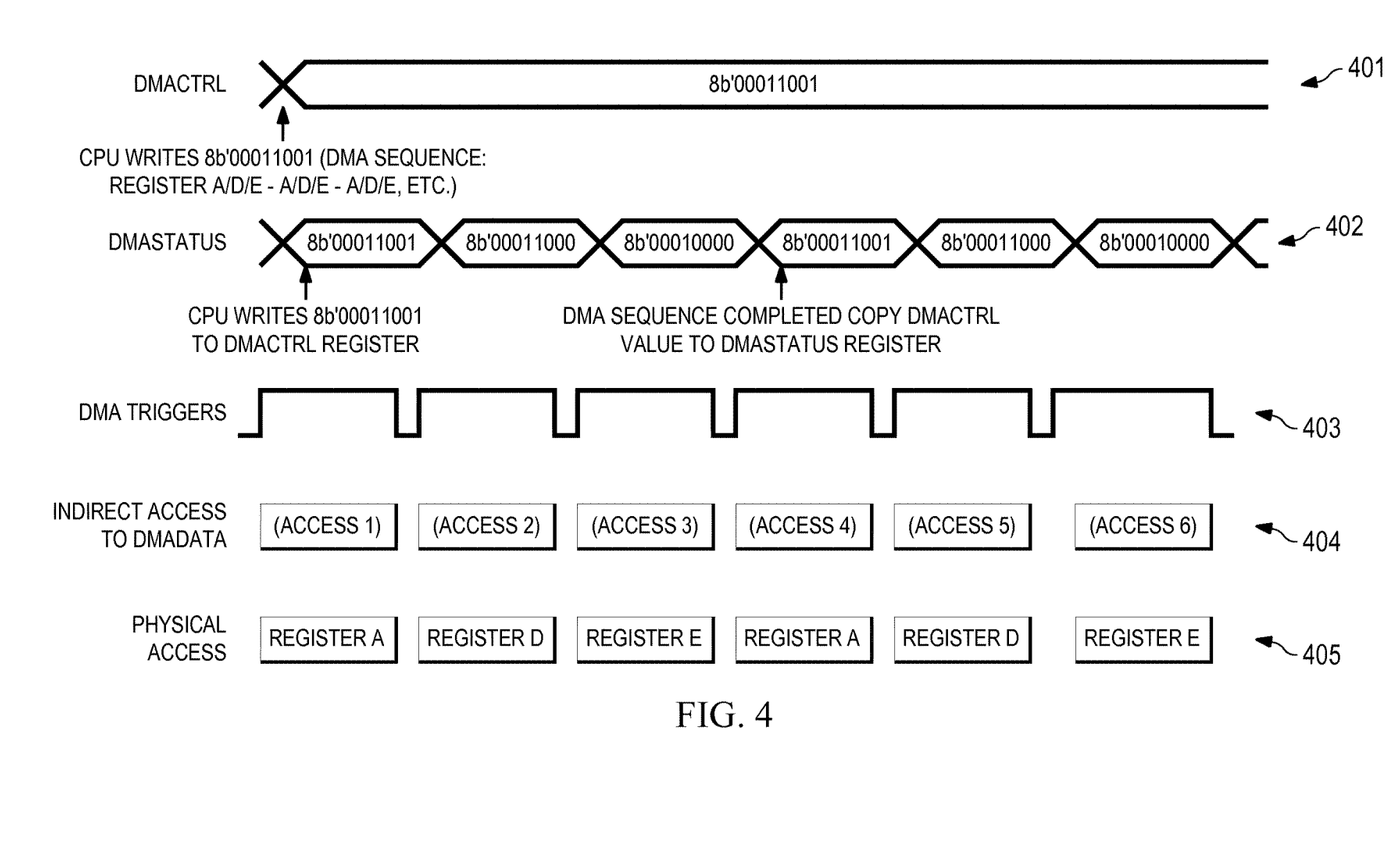
FIG. 4 includes event diagrams illustrating peripheral sequencing using DMA.

FIG. 4 includes event diagrams illustrating peripheral sequencing using DMA. A first event diagram 402 illustrates the writing of control register 206, a second event diagram 404 illustrates bit clearing in status register 208, a third event diagram 406 illustrates DMA triggers, a fourth event diagram 408 illustrates indirect access of physical memory and diagram 410 illustrates the physical address of the peripheral registers A-H.

As shown in FIG. 4, when the CPU writes control data to control register 206, status register 208 is automatically updated with the control data and the DMA sequence starts. While at least a bit is one in status register 208, a trigger is generated (e.g., by the peripheral). When the trigger is detected, DMA controller 202 will access (read/write) data register 210. Peripheral 204 detects this access to data register 210 and redirects the access to a physical memory address corresponding to the peripheral register. In some implementations, to detect an access to data register 210, peripheral 204 detects the first LSB set to 1 in status register 208. In other implementations, peripheral 204 detects the first MSB set to 1 in status register 208. When the access of data register 210 for a peripheral register is completed, the corresponding LSB (or MSB) for that peripheral register in status register 208 is cleared (reset to 0) and the DMA sequence restarts. When status register 208 has only one bit set to 1, it means that the current access is the last access in the DMA sequence. After the last access is completed, status register 208 is re-initialized with the value in control register 206.

Figure 5:
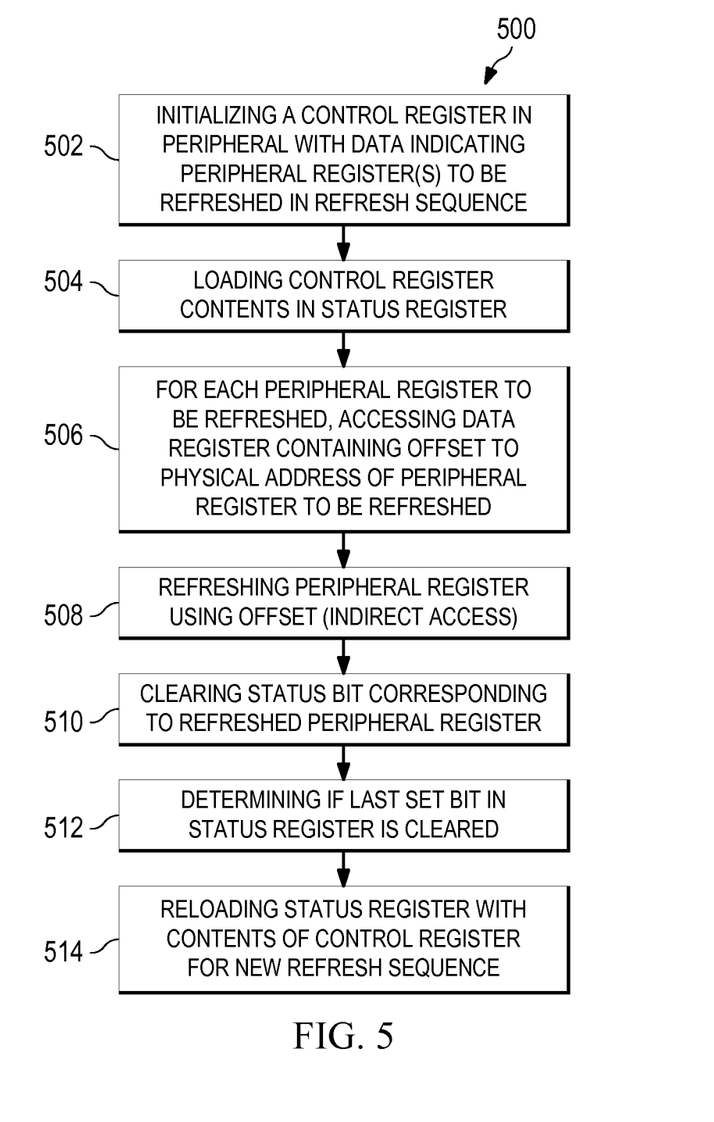
FIG. 5 is a flow diagram of an example process of peripheral sequencing using DMA.

FIG. 5 is a flow diagram of an example process 500 of peripheral sequencing using DMA. Process 500 can be implemented in hardware or software, or a combination of hardware and software. In some implementations, process 500 can be implemented in a DMA system of a microcontroller system.

In some implementations, process 500 can begin by initializing a control register (502) with control data indicating which peripheral register(s) are to be refreshed during the DMA sequence and initializing a status register (504). For example, the control data can include a set of bits, where each bit position corresponds to peripheral register. Bit positions that contain a 1 value are to be updated during the current DMA sequence and bit positions that contain a 0 value are not to be updated during the current DMA sequence. The control data can also be used to initialize the status register. In some implementations, the status register can have the same number of bits as the control register. In some implementations, a single register can be divided into two portions, where a first portion stores control bits and a second portion stores status bits. In some implementations, a bit value of 0 can indicate which peripheral registers are to be updated and bit value of 1 indicates which peripherals are not to be updated.

Process 500 can continue by, for each peripheral register to be refreshed, accessing (read/write) a data register (506). The peripheral detects the access of the data register and redirects the access to a corresponding physical memory address of the peripheral register using a memory map. Process 500 then updates the peripheral register (508).

Process 500 can continue by updating the status register (510) by clearing the status bit corresponding to the peripheral register that was refreshed.

Process 500 can continue by determining if the last bit in the status register has been cleared (512). If the last bit, process 500 returns to step (504) to initialize the status register again and start a new DMA sequence. In some implementations, when status register 208 has only one bit set to 1 the current access is the last access in the current DMA sequence. A request for a new refresh sequence is generated and the status register is again initialized to start a new DMA sequence to update or refresh peripheral registers.

In some examples, a new DMA sequence is started automatically when a previous sequence is completed, e.g., as described above. In some other examples, the new sequence can be started based on receipt of an event, e.g., from the event system 112 of FIG. 1. The source of the event can be a counter overflow, e.g., a real time counter (RTC) event such as a time kick or the like.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A method comprising:
   selecting one of a plurality of peripheral registers of a peripheral to be refreshed, the peripheral including a status register, data register and control register, the selecting based on control data in the control register;
   initializing the status register;
   starting a direct memory access (DMA) sequence;
   accessing the data register, the data register configured for storing data to be transferred to or from the selected peripheral register;
   refreshing one or more parameters stored in the selected peripheral register based on accessing the data register; and
   updating contents of the status register with a current status of the DMA sequence; and
   determining that the DMA sequence has been completed based on the contents of the status register.

2. The method of claim 1, where the control data is a set of bits and each bit position of the control register corresponds to a different peripheral register in the peripheral.

3. The method of claim 2, where the status register is initialized with the control data.

4. The method of claim 1, where accessing the data register provides indirect access to a physical memory address of the peripheral register.

5. The method of claim 4, where the peripheral detects the access of the data register and redirects the access to a corresponding physical memory address of the selected peripheral register.

6. The method of claim 3, where the status register is updated by clearing a control data bit corresponding to the selected peripheral register that was refreshed.

7. The method of claim 1, where the access sequence is determined to be completed if a last bit in the status register has been cleared.

8. A system comprising:
   a peripheral including a plurality of peripheral registers, a status register, a control register and a data register;
   a controller coupled to the peripheral by an access channel, the controller configured to:
   receive a request for data transfer to or from the peripheral;
   start a direct memory access (DMA) sequence for refreshing one or more parameters of the plurality of peripheral registers using the access channel;
   select one of the plurality of peripheral registers for refresh according to control data in the control register;
   access the data register in the peripheral, the data register configured for storing data to be transferred to or from the peripheral register;
   refresh one or more parameters stored in the selected peripheral register based on accessing the data register;
   update contents of the status register with a current status of the DMA access sequence; and
   determine that the access sequence is completed based on the contents of the status register.

9. The system of claim 8, where the control data is a set of bits and each bit position of the control register corresponds to a different peripheral register in the peripheral.

10. The system of claim 9, where the status register is initialized with the control data.

11. The system of claim 8, where accessing the data register provides indirect access to a physical memory address of the selected peripheral register.

12. The system of claim 11, where the peripheral detects the access of the data register and redirects the access to a corresponding physical memory address of the selected peripheral register.

13. The system of claim 10, where the status register is updated by clearing a control data bit corresponding to the selected peripheral register that was refreshed.

14. The system of claim 8, where the access sequence is determined to be completed if a last bit in the status register has been cleared.

15. The system of claim 8, where the system is included in a microcontroller system.

16. A non-transitory, computer-readable storage medium storing instructions, which, when executed by one or more processors, causes the one or more processors to perform operations, comprising:
   selecting one of a plurality of peripheral registers of a peripheral to be refreshed, the peripheral including a status register, data register and control register, the selecting based on control data in the control register
   initializing the status register;
   starting a direct memory access (DMA) sequence;
   accessing the data register, the data register configured for storing data to be transferred to or from the selected peripheral register;
   refreshing one or more parameters stored in the selected peripheral register based on accessing the data register; and
   updating contents of the status register with a current status of the DMA sequence; and
   determining that the DMA sequence has been completed based on the contents of the status register.

17. The non-transitory, computer-readable medium of claim 16, where the control data is a set of bits and each bit position corresponds to a different peripheral register in the peripheral.

18. The non-transitory, computer-readable medium of claim 17, where the status register is initialized with the control data.

19. The non-transitory, computer-readable medium of claim 18, where the status register is updated by clearing a control data bit corresponding to the selected peripheral register that was refreshed.

* * * * *

UNITED STATES PATENT AND TRADEMARK OFFICE
CERTIFICATE OF CORRECTION

PATENT NO. : 9,690,726 B2  
APPLICATION NO. : 14/538305  
DATED : June 27, 2017  
INVENTOR(S) : Laurentiu Birsan et al.

Page 1 of 1

It is certified that error appears in the above-identified patent and that said Letters Patent is hereby corrected as shown below:

In the Specification

Column 1, Line 44, replace "FIG." with -- FIGS. --;

In the Claims

Column 6, Line 18, delete "access"; and

Column 6, Line 48, replace "register" with -- register; --.

Signed and Sealed this  
Fifth Day of September, 2017

Joseph Matal  
*Performing the Functions and Duties of the*  
*Under Secretary of Commerce for Intellectual Property and*  
*Director of the United States Patent and Trademark Office*